United States Patent [19]

Leuschner

[11] Patent Number: 4,685,083
[45] Date of Patent: Aug. 4, 1987

[54] IMPROVED NONVOLATILE MEMORY CIRCUIT USING A DUAL NODE FLOATING GATE MEMORY CELL

[75] Inventor: Horst Leuschner, Phoenix, Ariz.

[73] Assignee: Thomson Components Mostek Corporation, Carrollton, Tex.

[21] Appl. No.: 783,493

[22] Filed: Oct. 3, 1985

[51] Int. Cl.⁴ .............................................. G11C 11/40
[52] U.S. Cl. .................................... 365/185; 365/228
[58] Field of Search ............... 365/185, 184, 189, 228, 365/154, 226, 104

[56] References Cited

U.S. PATENT DOCUMENTS

| | | | |
|---|---|---|---|
| 4,393,481 | 7/1983 | Owen et al. | 365/185 |
| 4,404,475 | 9/1983 | Drori et al. | 365/185 |
| 4,510,584 | 4/1985 | Dias et al. | 365/189 |

FOREIGN PATENT DOCUMENTS 2028615  3/1980  United Kingdom ............... 365/185

Primary Examiner—James W. Moffitt
Assistant Examiner—Glenn A. Gossage
Attorney, Agent, or Firm—Roland Plottel

[57] ABSTRACT

An improved nonvolatile memory has an adaptive system to regulate the charging current supplied to store data on nonvolatile storage nodes in order to provide acceptability low strain on the tunnel oxide and to compensate for process variations and change in the Fowler-Nordheim tunnel oxide transport characteristics caused by electron trapping over time.

5 Claims, 7 Drawing Figures

IMPROVED NONVOLATILE MEMORY CIRCUIT USING A DUAL NODE FLOATING GATE MEMORY CELL

DESCRIPTION

1. Technical Field

The field of the invention is that of nonvolatile integrated circuit memories. In particular, the field is that of a nonvolatile memory cell designed for improved reliability features.

2. Background Art

U.S. Pat. No. 4,510,584, issued to Leuschner, Guterman, Proebsting and Dias, assigned to the assignee hereof, discloses an improved nonvolatile memory storage cell and associated circuitry. A problem associated with single nonvolatile storage nodes of the tunnel oxide type is that of obtaining a sufficiently low Fowler-Nordheim current through the tunnel oxide in order to avoid deleterious strains on the very thin layer of tunnel oxide. The reason for this concern is that trapped electrons in the oxide distort the electric field and a sufficiently great distortion can cause a field so high that the oxide is ruptured.

For greater reliability of nonvolatile storage cells, it is desirable to have a low storage voltage sufficient for sensing and margin requirement; to provide an increase in the storage over a period of time to compensate for trapped electrons within the tunnel oxide; and to avoid high current surges by maintaining sufficiently low constant currents during the storage cycle, which eliminate high field gradients resulting from a sudden change in voltage.

In the prior art, it has been necessary to compensate for process variations during manufacture by storing excess charge on the floating gate of the Fowler-Nordheim element. This excess charge puts unnecessary strain on the tunnel oxide, eventually leaking charge off the nonvolatile storage element.

Prior art storage cells also typically require a high voltage regulator which is difficult to have track with the nonvolatile element on an integrated circuit chip, a timer (perhaps with an external capacitor), and a large charge pump in order to produce the excess voltage that is required for reliable storage.

SUMMARY OF THE INVENTION

The invention relates to an improved nonvolatile memory having an adaptive system to regulate the charging current supplied to store data on nonvolatile storage nodes in order to provide acceptably low strain on the tunnel oxide and to compensate for process variations and change in the Fowler-Nordheim tunnel oxide transport characteristic caused by electron trapping over time.

A feature of the invention is the use of circuitry providing signals indicating the maximum and minimum of voltages on the floating gates of the two complementary storage nodes.

BEST MODE FOR CARRYING OUT THE INVENTION

Figure 1:
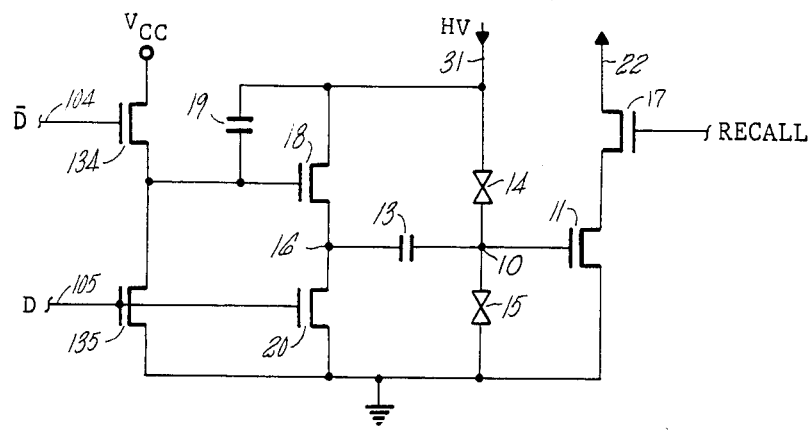
FIG. 1 illustrates a prior art nonvolatile storage node.

Referring now to FIG. 1, a prior art nonvolatile storage cell using Fowler-Nordheim tunneling is illustrated in which nonvolatile node 10 is the floating gate of sense transistor 11 so that sense transistor 11 will be on or off when node 10 is positive or negative in charge. Charge will flow to and from node 10 through the Fowler-Nordheim tunneling elements 14 and 15, indicated by conventional symbols. If it is desired to store a positive charge on node 10, so that transistor 11 is turned on during the recall operation, then high voltage line 31 will be increased in voltage to a sufficiently high voltage, conventionally about 20 or 25 volts, while node 16 is maintained at a low voltage. The low voltage connection is effected by turning on transistor 20 through line 105, which is connected to any conventional volatile storage cell, illustratively a conventional 6 transistor static RAM cell. Line 104 is the complementary connection to the storage cell. When node 16 is low, close to ground, and line 31 is high, node 10, the gate of transistor 11, will rise to a voltage which will be determined approximately by the relative capacitance in the capacitive divider formed by the dominant coupling capacitor 13 connected betwen node 16 and node 10 and the capacitance of the Fowler-Nordheim element 14. The cell is designed so that capacitor 13 has approximately 10 times the capacitance of the tunnel oxide layer which is the element 14, thereby coupling the floating node 10 closely to node 16. As line 31 rises in voltage, electrons will be pulled off floating gate 10 by tunneling through the oxide layer of element 14 in the well known Fowler-Nordheim process. The result will be a net positive charge on floating gate 10, as is required.

If it is desired to turn transistor 11 off, floating gate 10 must have a net negative charge. In this case node 16 is connected to high voltage line 31 by turning transistor 18 on and transistor 20 off. Line 104 will then be high, turning on transistors 134 and 18. Line 105 will be low, turning off transistor 135 and transistor 20. By virtue of conventional precharge and capacitive bootstrapping of capacitor 19 using conventional circuitry that is omitted from the drawing, node 16 will rise in voltage to the level of line 31. Node 10 will rise in voltage because of coupling provided by capacitor 13. Electrons will therefore be pulled from ground through the thin oxide of element 15 on to the gate of transistor 11, canceling out any positive charge that may be there from a previous store cycle and leaving the gate with a net negative charge.

At the end of a storage operation, line 31 is returned to ground and the state of transistor 11 is determined by the net charge on floating gate 10. When it is desired to recall the data stored in the storage node, a recall signal turns on transistor 17, exposing the output line 22 to the state of sense transistor 11 (on or off as the case may be). Line 22 may be connected back to the volatile storage cell.

This particular storage node is described further in U.S. Pat. No. 4,510,584, but may other nonvolatile storage nodes are known in the art.

As was mentioed before, the nonvolatile storage cell will be connected through lines 104 and 105 to any conventional volatile static RAM storage cell. Conventionally, a volatile storage cell is designed with a built-in imbalance, so that when power is first turned on the cell is in a preset state. When it is desired to recall data from the nonvolatile cell, it may be necessary to overcome this preset state and impose the state of the volatile cell. There is, thus, a minimum requirement on the nonvolatile cell—that it be able to overcome the default state of the volatile cell. In particular, transistor 11 must be turned on sufficiently hard when necessary so that enough current passes through transistor 11 and recall transistor 17 to overcome any resistance given by the opposite state in the volatile cell.

For conventional parameters of nonvolatile cells, this requirement implies that a minimum stored voltage on the floating gate 10 to provide a reliable recall is between at least two and three volts. Since there will be variations in the processing of integrated circuits, it will be necessary, for a production memory, that the circuit be designed so that the worst case voltage on floating gate 10 will be in the range of two to three volts. This requirement, in turn, imposes corresponding constraints on the voltage on line 31 in order to insure that a sufficient charge is deposited on node 10 in all cases.

Figure 2:
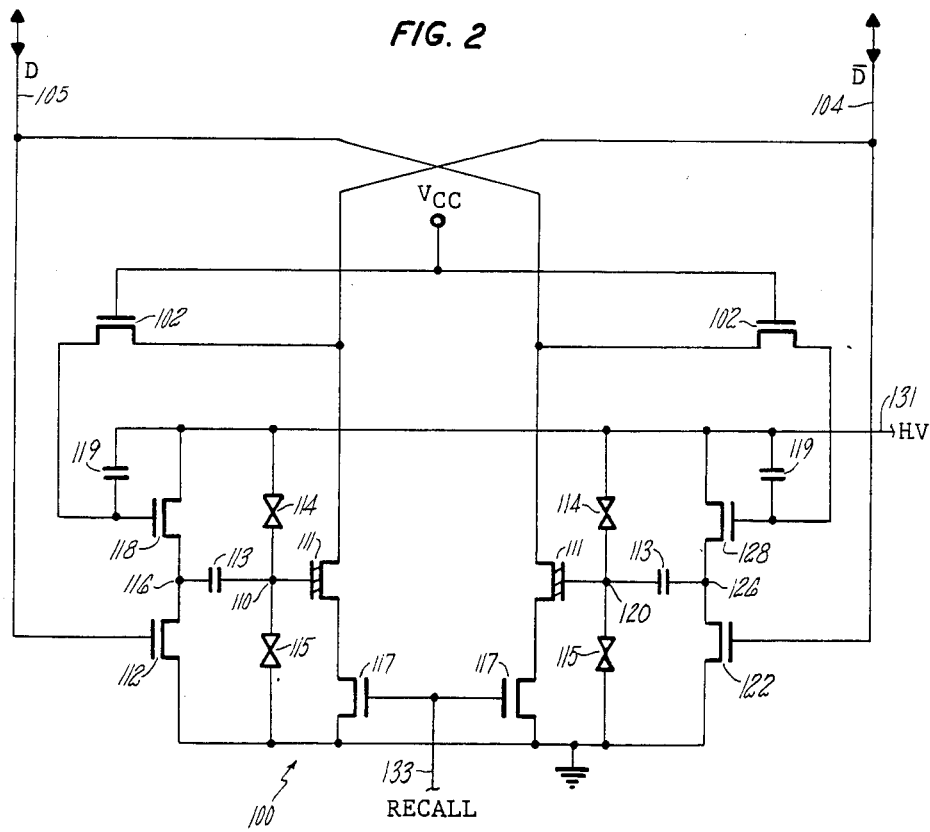
FIG. 2 illustrates a complementary nonvolatile storage cell constructed according to the invention.

Referring now to FIG. 2, the dual node circuit shown has a much more reliable form of data recall than the circuit of FIG. 1. In this circuit, there are two nonvolatile storage nodes, each similar to that of FIG. 1, which are connected in complementary fashion and modified slightly. The same lines 104 and 105 go to any conventional static RAM based volatile storage cell. Two storage nodes are indicated on the left and right of the figure, 110 and 120 respectively, in which circuit elements having the same function as those in FIG. 1 are indicated by a corresponding numeral. On the left side, nonvolatile floating gate 110 is connected to coupling capacitor 113 and Fowler-Nordheim elements 114 and 115, all of which have the same function as their counterparts in FIG. 1. The sense transistor 111 is now a depletion transistor, not an enhancement transistor, for reasons that will be described below. Node 116 is connected either to ground through transistor 112 or to a high voltage line 131 through transistor 118, as was the case in FIG. 1. Capacitor 119 provides the same bootstrapping function for transistor 118 that capacitor 19 provided in the circuit of FIG. 1. Transistors 102 serve to isolate the two nodes. Recall transistor 117 is controlled by recall line 133, also as in FIG. 1. The right-hand circuit uses the same reference numeral for complementary circuit elements except for node 120 transistors 122, 128 and node 126, which are numbered 10 higher than the left hand element to which it corresponds.

A basic advantage of using a dual node complementary system such as that disclosed in FIG. 2 is that process variations are totally compensated by the complementary arrangement, so that is not necessary to provide most of the safety margins that were necessary with a single storage node. In particular, in order to recall data from a nonvolatile cell to the counterpart volatile cell, all that is necessary is that one of transistors 111 be turned on to a greater degree than the other. The prior art requirement of a minimum floating gate voltage differential between complementary data states of two to three volts has disappeared. Furthermore because of the active nature of the recall, the nonvolatile cell of FIG. 2 may be coupled to any volatile storage cell such as a pair of cross-coupled inverters like the conventional six transistor static RAM cell, a NOR-gate latch, a NAND-gate latch, or a master-slave flip-flop.

There is a further difference between the individual halves of the dual node circuit of FIG. 2 and single node the circuit of FIG. 1, in that the sense transistor is now a depletion transistor, so that there is no threshold voltage requirement. This feature is not necessary, but it eliminates any dead zone of positive floating gate voltage which would exist from zero volts to a threshold voltage, $V_T$, of an enhancement transistor, and which would have to be overcome for the positive or conducting floating gate data state. Consequently, the absence of a dead zone produces a corresponding reduction on the high voltage level that would otherwise have to be placed on line 131 in order to store data.

In a particular case, for tunnel oxide thickness of 50 Angstroms and typical control gate (nodes 116 and 126) to floating gate (nodes 110 and 120) capacitance ratios of 0.8, a reasonable value of maximum voltage on line 131 is 10 volts. With the maximum voltage differential across either tunneling element clamped to about 5.5 volts by high Fowler-Nordheim tunneling conduction, this will result in a net voltage of $+2.5$ v and $-2.5$ volts on the positively and negtively charged floating gate, respectively, once line 131 is returned to 0 volts. In a single nonvolatile storage node, that 2.5 volt storage level may be barely sufficient to ensure proper data sensing, depending on the details of the current magnitudes required from the nonvolatile element to overcome the volatile element and insure proper recall. In the case of the circuit of FIG. 2, a voltage of $+2.5$ volts and $-2.5$ v nodes 110 and 120 respectively results in a net difference of 5 volts in the degree of which transistors 111 are turned on. Both will be turned on but one will have 5 volts more of turn-on, thus there will be a considerable difference in the driving force of the recall.

It will be evident to those skilled in the art that this nonvolatile storage cell is quite large and thus the applications of this cell for use in primary storage will be limited to those cases in which only a relatively small number of bits need to be stored. As will be described below, there is a further application of this cell—namely, as a reference cell in an array of single storage nodes.

Figure 3:
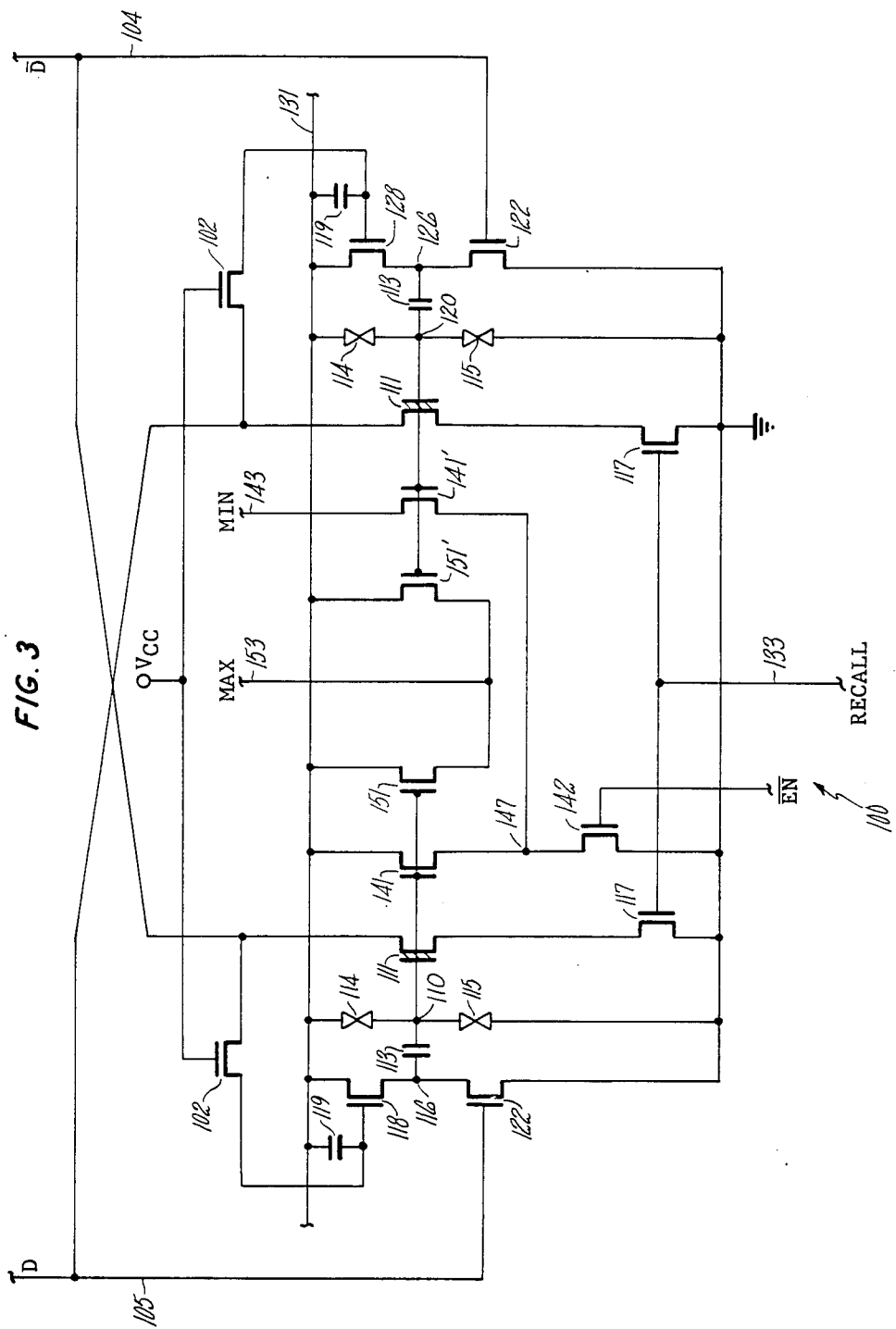
FIG. 3 illustrates an improved complementary dual node nonvolatile storage cell.

Referring now to FIG. 3, the circuit shown there is the same as FIG. 2 with the addition of an extra five transistors in the center of the diagram. The complementary nonvolatile storage nodes are as before, but additional circuitry is provided to produce on lines 143 and 153 the minimum and maximum voltage on the two nonvolatile nodes, respectively.

The maximum voltage is provided by the parallel transistors 151 and 151' which are connected to nodes 110 and 120 respectively. Current flows from line 131 through each of transistors 151 and out line 153. Since these transistors function as diodes, the voltage on line 153 will be the greater of the voltages on nodes 110 and 120.

Transistors 141 and 141' are connected in series to line 143. An $\overline{EN}$ signal on transistor 142 is only used to precharge node 147 between transistors 141 and 141' to ground just prior to store. Because of the series connection, the voltage on line 143 will be limited by the lesser of the two voltages stored on nodes 110 and 120 thereby providing a minimum voltage. These two signals tracking the two voltages on the nonvolatile storage nodes will be used, as described below, in an adaptive circuit that controls the termination of charging current to the nonvolatile storage nodes to promote enhanced reliability and to make use of a simplified charging circuit.

Because of the exponential time dependence of this process, the voltage on a nonvolatile Fowler-Nordheim storage node (as for example on 10 of FIG. 1) approaches an asymptotic value at which the voltages on both nodes 110 and 120 will be equal; i.e. the voltages on lines 143 and 153 will be equal. In operation, the charging process will be stopped when the differences between the maximum and minimum voltages reaches a certain value that will be chosen in order to provide a compromise between speedy charging time with accompanying minimum stress and reliable sensing.

One feature of the invention is a system that produces a voltage on line 131 that is a linear ramp as a function of time, thus producing for a given transported charge in a given time the minimum strain on the thin tunnel oxides of the nonvolatile storage elements. This linear ramp is produced by a novel combination of a charge pump oscillator having two complementary outputs and exhibiting essentially no flat spots on the sawtooth, output configuration, with a charge pump which is regulated by a slew rate regulator that controls the current flowing into high voltage line 131. The charging process is terminated when a reference circuit, which may be a single complementary storage cell as disclosed in FIG. 3, produces a maximum and minimum voltage on lines 143 and 153 that are within a predetermined margin of each other.

Figure 4:
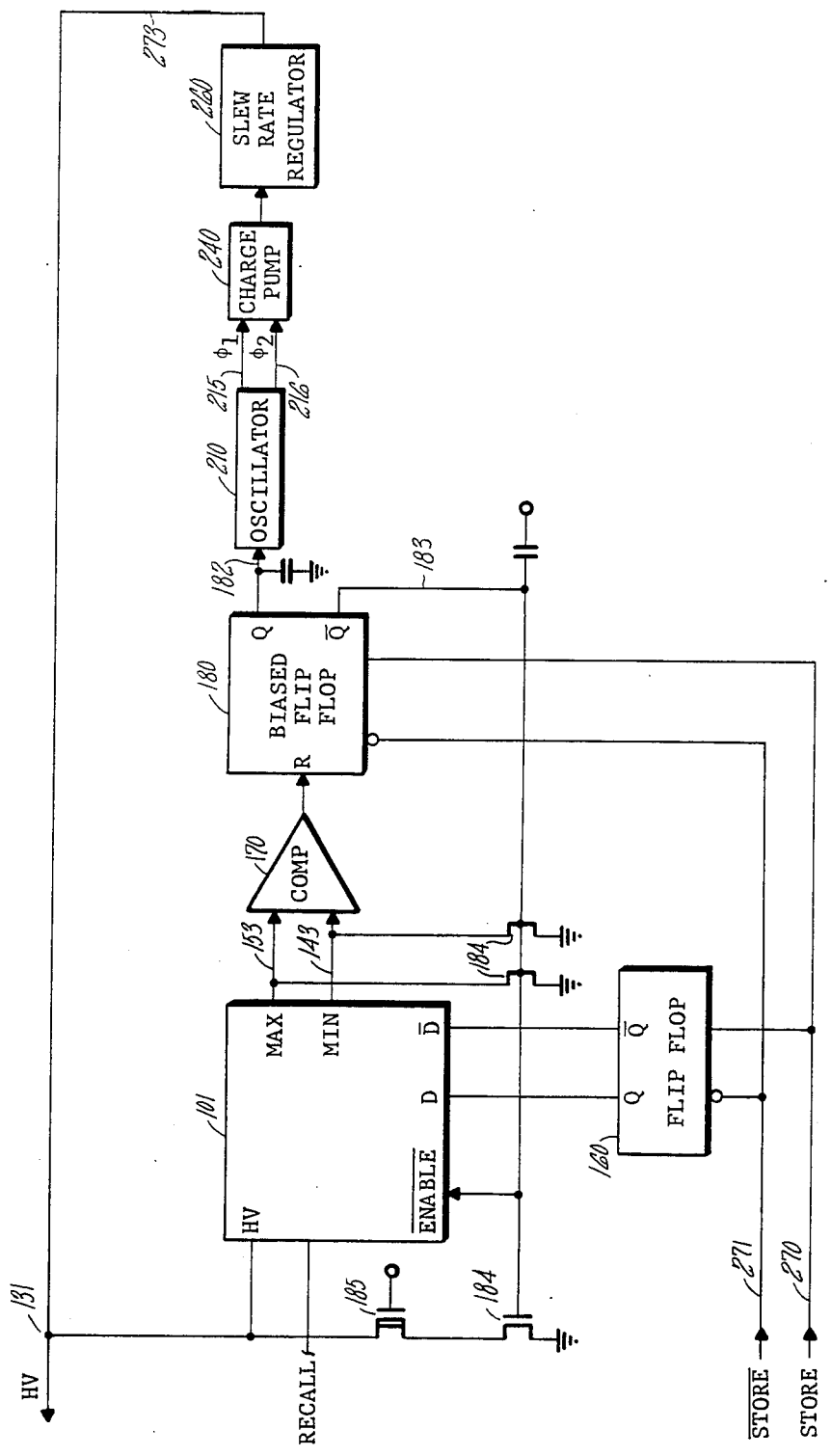
FIG. 4 illustrates a block diagram of an adaptive charging system for storing data in nonvolatile storage cells.

Referring now to FIG. 4, the storage process is initiated by signals on lines store and store, 270 and 271 respectively, which come from external logic. These signals trigger flip-flop 160, which is illustratively a perfectly symmetrical master-slave T-flip-flop. Flip-flop 160, in turn, initiates the reversal of state in circuit 101 which is illustratively the complementary nonvolatile storage cell of FIG. 3. Lines 143 and 153 of the nonvolatile storage cell pass to comparator circuit 170 which changes state when the voltages on lines 143 and 153 are sufficiently close. The output of comparator 170 is connected to the reset input of flip-flop 180. Flip-flop 180 is another master-slave flip-flop with reset, which is constructed with a built-in bias so that it is turned on in a preset configuration in which the output Q, line 182, is at low voltage and $\overline{Q}$, on line 183, is at high voltage. Initially, transistors 184 are all turned on by line 183, discharging lines 153, 143 and 131 to ground at the initial turn-on of the system. When the store signal is received, the Q output of flip-flop 180 goes high, enabling oscillator 210, which causes the voltage on line 131 to rise, simultaneously, the $\overline{Q}$ output goes low, cutting off transistors 184 and allowing nodes 131, 143 and 153 to rise. When the floating gate voltages in reference circuit 101 rise sufficiently so that the voltages on lines 143 and 153 are within a preset magnitude of each other, comparator 170 resets flip-flop 180 which in turn disables oscillator 210 and stops the voltage ramp, discharging lines 131, 143 and 153 through transistors 184. The advantage of this process is that the value of the high voltage on line 131 and the time required to reach that high voltage will adapt to variations in processing (e.g. tunnel oxide variation) and to changes in tunnel oxide characteristics with storage history. As time goes on, some electrons will be trapped within the tunnel oxide causing the voltage to be less effective, but reference cell 101 will automatically compensate for that.

In an application in which a large number of bits are to be stored in nonvolatile memory, there may be insufficient room on-chip to be able to have all the bits shadowed by a complementary cell like that of FIG. 3. In that case, an array cell similar to that of FIG. 1 may be used and the reference cell 101 may be the complementary cell of FIG. 3. Many of the advantages of the invention will be retained, since cell 101 will track variations in processing and data storage cycling history that apply to the single node storage cells within the array.

A particular application may involve a sufficiently small number of bits so that the reference cell may be replaced by an analog AND and OR of the minimum and maximum of all the storage bits. In that case, the storage voltage on line 131 will be controlled by the worst case actual storage bit in the array. This situation is implemented by having the voltage on line 153 be the wired OR of all the parallel source follower transistors within the separate complementary storage nodes in the array and the voltage on line 143 would be the series combination of the other source followers. In that case, the circuit of FIG. 3 would be modified so that the transistors in the minimum voltage chain are connected serially one to another.

The use of the adaptive storage loop of FIG. 4 results in a number of improvements for an integrated circuit. For example, there will be no need for a high voltage regulator on the chip or off the chip. Also there will be no need for a timer to control the length of application of the storage voltage. The circuit tracks and compensates for tunnel oxide variations created during the processing steps. It also compensates for electron trapping efects during the life of the chip. It minimizes the transport of charge through the tunnel oxide, while ensuring proper charge storage margins, making it no longer necessary to store an excess charge in order to compensate for processing variations and thus improving the lifetime and reliability of the chip.

The source of the store signals will not be discussed in this application as they are not part of the invention. Conventionally, a nonvolatile memory integrated circuit will need a recall signal when the power is first turned on in order to set the volatile memories to the data stored in nonvolatile memory. It will also need a store signal determined by the system logic, such as a signal generated in response to a power failure. Circuitry providing these signals is conventional and is not needed for an explanation of the invention. Similarly, the symmetric flip-flop 160 and the biased flip-flop 180 are conventional and those skilled in the art will readily be able to implement them. The comparator circuit 170 is also conventional and will not be explained in the application.

Figure 5A:
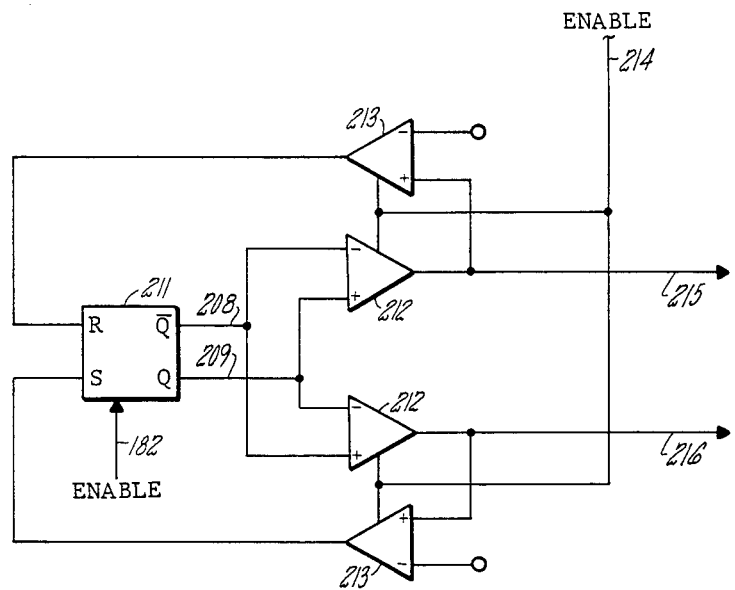
FIGS. 5a and 5b illustrate details of the system of FIG. 4.
Figure 5B:
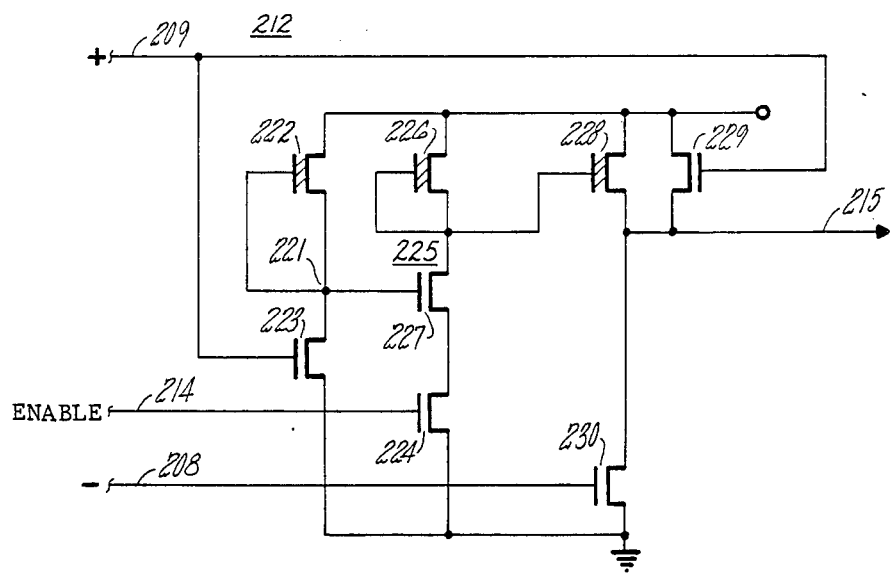

Charge pump oscillator 210 must meet different requirements than do usual charge pump oscillators in the prior art. For this application, the requirement of the voltage on line 131 is not so much that it supply voltage but rather that it supply a constant current coming from a high voltage source, to avoid overstressing Fowler-Nordheim tunneling oxides. This requirement is reflected in a requirement on the oscillator that the charge pump produce as smooth as possible a current flow over a wide voltage range. Since the output current of a charge pump is proportional to the rate of change of voltage in time, the oscillator output waveform should be a complementary sawtooth. For high charge pump efficiency, the sawtooth peak should be as close as possible to VCC and for the lowest output impedance of the charge pump, the oscillator frequency should be maximized, i.e. there should be no flat portion in the sawtooth waveform; but rather it should drop immediately as soon as it reaches the maximum value. Such a waveform is provided by the circuits of FIGS. 5a and 5b, in which an RS-latch, which is basically two cross-coupled NOR-gates, is enabled by a signal on line 182 of FIG. 4 and produces complementary outputs on lines 209 and 208 to a pair of symmetric buffer circuits 212 which are shown in FIG. 5b. When one of buffer circuits 212 reaches an output voltage which is within a preset value of VCC, comparator 213 changes state, resetting the RS-latch and switching to the other phase of the sawtooth. The particular embodiment illustrated uses a value of 0.1 volt for the margin between the sawtooth peak and VCC. Those skilled in the art will readily be able to choose a peak value that is suited to their own system. The outputs on lines 215 and 216 are a pair of complementary sawtooth signals, in which one phase is dropping from the peak to ground as the other phase passes a transition threshold voltage. The first phase then remains at ground until the second phase reaches its peak in turn.

The buffer circuits 212 which produce the two output phases drive charge pump 240 which presents a capacitive load. A danger in this situation is that the output circuit of the buffer can have very large current surges as it changes state. Unless precautions are taken, the current spikes which result could produce a disastrous surge in current on lines 131 that could destroy the tunnel oxide. The particular configuration or buffer 212 shown in FIG. 5b avoids this danger. In FIG. 5b, lines 208 and 209 are the inputs from latch 211. When line 208 is low and 209 is high, the circuit 212 shown will be generating the sawtooth ramp (and the other phase will be at ground). In that case, transistor 230 will be turned off by line 208 so that the output node 215 will be controlled by the pair of pull up transistors, depletion transistor 228 and enhancement transistor 229. The signal to transistor 228, which is a small to medium depletion transistor, is controlled by two series connected inverters 221 and 225. Inverter 221, consisting of transistors 222 and 223, responds to the positive voltage on line 209 to control the gate of transistor 227 in the second inverter. The inverter is enabled by a control signal on line 214, to the gate of transistor 224.

Figure 6:
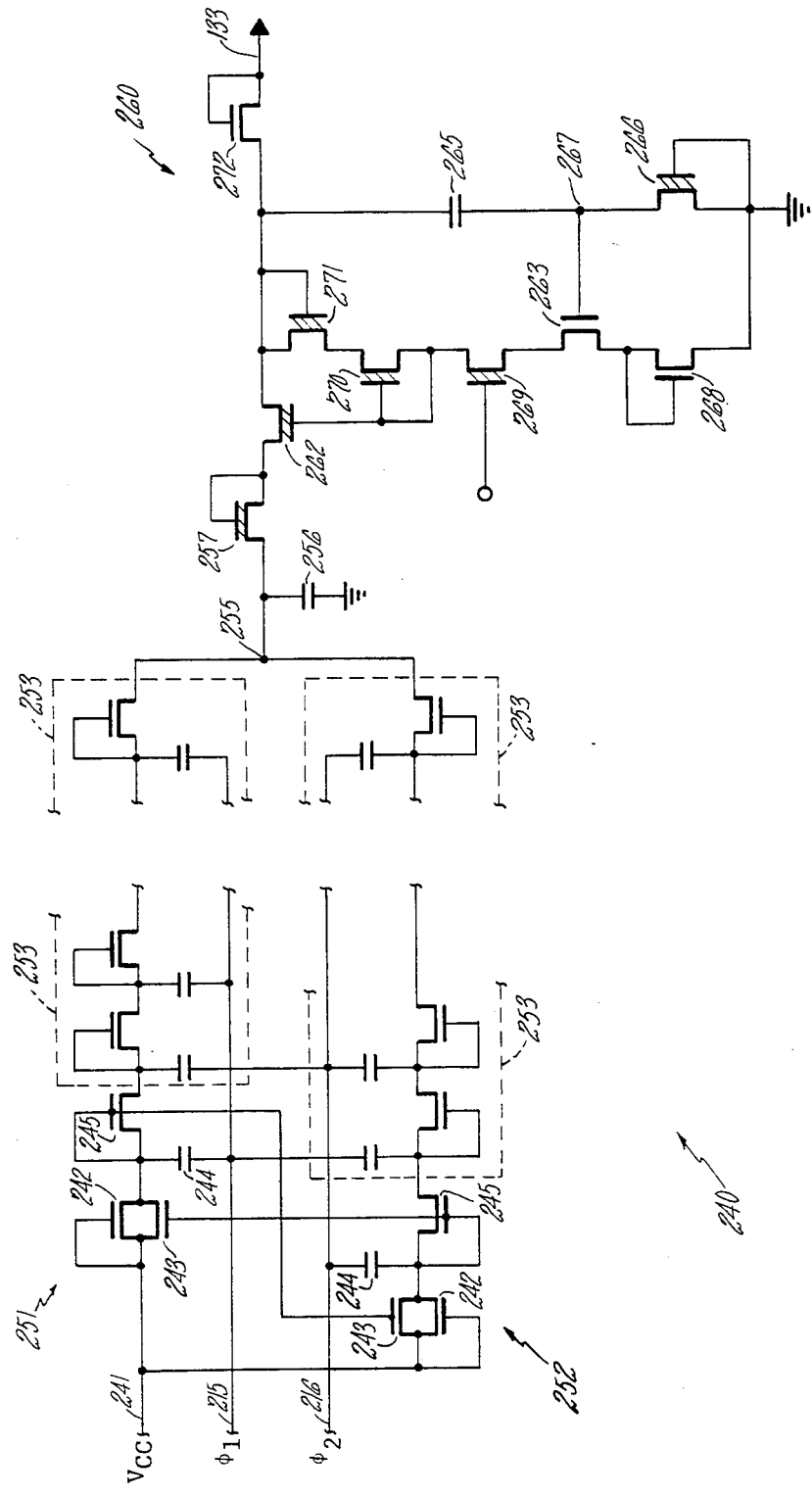
FIG. 6 illustrates details of a charge pump and current regulator used in the system of FIG. 4.

The output from the second inverter is taken from the source of transistor 226 and controls the gate of transistor 228. The size ratios of the transistors within inverters 221 and 225 are controlled as is known to those skilled in the art in order to have a relatively slow response to a positive going input and a fast response to a negative going output. The combination of load capacitance, which will be different for different systems, the output natural pull up transistor, the output depletion pull up transistor, and the relatively weak pull-up obtained from the inverters, determine the shape and rise time of the output phase. Those skilled in the art will readily be able to taper the rise shape of the sawtooth by adjusting these parameters in order to produce a high degree of linearity. The two complementary sawtooth wave forms $\Phi_1$ and $\Phi_2$, on lines 215 and 216 respectively, enter charge pump 240, as is shown in FIG. 6, charge pump 240 is a multi-stage charge pump having modules 253 which comprise a pair of capacitor-transistor and diode configured combinations triggered by an alternation by the phases in lines 215 and 216. These stages 253 are repeated as determined by the system requirements in order to produce the required voltage. In this system, there are fourteen stages which results in a theoretical peak voltage that is well in excess of system requirements. The reason for having higher voltage capability than needed by the nonvolatile element is that it is desired to have the output impedance of the charge pump determine the load current, rather than the load impedance. This is because the load will vary depending upon the number of nonvolatile cells that are to be switched at any particular time. If there is no change in the nonvolatile data, then no cells will need to change state and the load will be very different from that when a large number of cells have to be switched. The input of circuit 240 has a different feature in that the two diode configured transistors 242 in the two halves 251 and 252 of the charge pump are connected in parallel with transistors 243 each of the charge pump. The reason for this is to improve the voltage efficiency of first stage by eliminating the first stage enhancement threshold drop.

The output of charge pump 240 goes on line 255 to an RC filter comprising capacitor 256 and current limiting series transistor 257 and then passes to the slew rate regulator circuit 260. This regulator is a combination of series and shunt regulator in which the series control is provided by transistor 262 and the shunt is provided by diverting current to ground through the chain comprising of transistors 271, 270, 269, 263 and 268. The two regulators, series and shunt, comprise a feedback loop circuit in which the voltage on node 267 depends on the rate of change of voltage on line 255 through the coupling of capacitor 265 to node 267. Transistor 266 is effectively a current sink so that the voltage on node 267 changes through the coupling of capacitor 265 and controls the turn-on of transistor 263. Thus, a greater or lesser amount of current will drain from node 255 down to ground through this chain of transistors, depending on the rate of change of voltage on the output of the charge pump. The change in gain of transistor 263 will, in turn, be reflected by a change in voltage on the node between transistors 269 and 270. This voltage in turn controls the gain of transistor 262. Thus, a change in voltage on the output will control the impedance of transistor 262 and thus the current flowing through it. The output transistor 272 serves to decouple the purely capacitive load of line 131 from the regulator circuit.

The adaptive system shown in FIG. 4 may be used in whole or in part, the advantages of the various parts being summarized below. The feedback complementary sawtooth oscillator produces optimization of the charge pump clock phases and a corresponding minimization of the ripple in the high voltage output current that is independent of the supply voltage and the changing load capacitance. The complementary charge pump (full wave rectified) with the output filter also produces a reduction of the ripple in the output current and a lowering of the output impedance that is equivalent to doubling the clock frequency of a non-complemented charge pump (half-wave rectified) but is achieved without the difficulty of producing a higher frequency clock. The slew rate regulator—a combined series-/shunt regulator—produces a constant current over a varying voltage that reduces the stress on the tunnel oxide to a minimum and results in a corresponding improvement in the lifetime of the chip.

The adaptive programming loop produces a self-timed high voltage ramp that eliminates the need for a timer either on-chip or off-chip to control the length of application of the tunneling high voltage. A second advantage is that the stress free voltage will be applied in the minimum time. A third advantage is that the minimum voltage will be applied because there is not a need to compensate for processing variations since the system is adaptive. Also, the circuit compensates as a function of time and use for trapped electrons; additionally, the system adapts for different tunnel oxides.

I claim:

1. A nonvolatile memory circuit comprising an array of nonvolatile memory elements;
   means for applying data to said array of nonvolatile memory elements; and
   means for applying high voltage to selected terminals of said nonvolatile memory elements, thereby storing said data applied to said array of nonvolatile memory elements;
   characterized in that:
   said means for applying high voltage comprises at least one dual node floating gate nonvolatile memory cell having first and second floating gates for defining a complementary pair of storage nodes and a maximum voltage terminal and a minimum voltage terminal, said terminals carrying the maximum and minimum voltage of those voltages on said first and second floating gates of said at least one dual node memory cell;
   comparison means for comparing said maximum and minimum voltages; and
   means for terminating the application of high voltage to said selected terminals in response to a signal from said comparison means indicating a voltage difference between said maximum and minimum voltages less than a predetermined cutoff value.

2. A nonvolatile memory circuit according to claim 1, further characterized in that:
   said means for applying high voltage further comprises charge pump means, controlled by said comparison means, for generating current from a charge pump output terminal at said high voltage and current regulator means connected to said charge pump output terminal for limiting the magnitude of current flowing from said charge pump.

3. A nonvolatile memory circuit according to claim 1, further characterized in that:
   said circuit comprises at least one dual node floating gate nonvolatile reference memory element connected to said comparison means; and
   at least one nonvolatile data memory element connected to a data terminal for storing data on said data terminal by application of high voltage to a selected terminal of said nonvolatile data memory element, said high voltage being under control of said reference memory element.

4. A nonvolatile memory circuit according to claim 1, further characterized in that:
   said entire array of nonvolatile memory elements cmprises dual node floating gate memory cells, each having said maximum and minimum voltage terminals, at least two sets of said maximum and minimum voltage terminals being interconnected to provide the highest maximum voltage and the lowest minimum voltage of said maximum and minimum voltage terminals.

5. A nonvolatile memory circuit in accordance with claim 1 further characterized in that each of the dual node floating gate nonvolatile memory cells in of the type employing Fowler-Nordheim tunneling and cmprises a balanced circuit which includes a complementary pair of storage nodes, each of which is provided by a floating gate of a depletion mode sense transistor that is serially connected with an enhancement mode recall transistor, each storage node being connected to the node between a different pair of Fowler-Nordheim tunneling elements across which pair is to be applied a high data-storing voltage.

* * * * *